(12) United States Patent
Annunziata et al.

(10) Patent No.: US 9,537,086 B1
(45) Date of Patent: Jan. 3, 2017

(54) LINEAR MAGNETORESISTIVE RANDOM ACCESS MEMORY DEVICE WITH A SELF-ALIGNED CONTACT ABOVE MRAM NANOWIRE

(71) Applicant: International Business Machines Corporation, Armonk, NY (US)

(72) Inventors: Anthony J. Annunziata, Stamford, CT (US); Rohit Kilaru, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/950,299

(22) Filed: Nov. 24, 2015

Related U.S. Application Data

(63) Continuation of application No. 14/830,913, filed on Aug. 20, 2015.

(51) Int. Cl.
| | |
|---|---|
| H01L 43/12 | (2006.01) |
| H01L 43/02 | (2006.01) |
| H01L 27/22 | (2006.01) |
| H01L 43/08 | (2006.01) |

(52) U.S. Cl.
CPC ............ *H01L 43/02* (2013.01); *H01L 27/222* (2013.01); *H01L 43/08* (2013.01); *H01L 43/12* (2013.01)

(58) Field of Classification Search
CPC ........ H01L 27/22; H01L 27/222; H01L 29/82; H01L 43/02; H01L 43/12
See application file for complete search history.

(56) References Cited

U.S. PATENT DOCUMENTS

| | | | |
|---|---|---|---|
| 6,358,757 B2* | 3/2002 | Anthony | B82Y 10/00 257/E21.665 |
| 2002/0132464 A1* | 9/2002 | Lee | H01L 27/222 438/618 |
| 2005/0102720 A1* | 5/2005 | Lee | H01L 43/12 438/3 |

(Continued)

OTHER PUBLICATIONS

Definition of "Abut", http://www.dictionary.com (2015).*

(Continued)

*Primary Examiner* — Michele Fan
(74) *Attorney, Agent, or Firm* — Cantor Colburn LLP; Vazken Alexanian

(57) ABSTRACT

A technique relates to a linear magnetoresistive random access memory (MRAM) device. A linear magnetic tunnel junction structure includes a non-magnetic tunnel barrier on top of a reference layer and a free layer on top of the non-magnetic tunnel barrier, where the linear magnetic tunnel junction structure is in a line. Magnetoresistive random access memory (MRAM) devices are formed of the reference layer, the non-magnetic tunnel barrier, and the free layer, each of the MRAM devices are in the line. Self-aligned contacts are formed on top of the linear magnetic tunnel junction structure, and the self-aligned contacts individually define the MRAM devices. The self-aligned contacts are separated from one another in the line. Bottom conductive vias are underneath the linear magnetic tunnel junction structure. The bottom conductive vias abut the reference layer of the linear magnetic tunnel junction structure.

9 Claims, 12 Drawing Sheets

(56) References Cited

U.S. PATENT DOCUMENTS

| | | | | |
|---|---|---|---|---|
| 2005/0258469 | A1* | 11/2005 | Guo | B82Y 25/00 |
| | | | | 257/314 |
| 2006/0051881 | A1* | 3/2006 | Ditizio | H01L 43/12 |
| | | | | 438/3 |
| 2009/0104718 | A1* | 4/2009 | Zhong | B82Y 10/00 |
| | | | | 438/3 |
| 2010/0020592 | A1* | 1/2010 | Hosotani | G11C 11/16 |
| | | | | 365/158 |
| 2010/0240151 | A1* | 9/2010 | Belen | H01L 43/12 |
| | | | | 438/3 |
| 2012/0244639 | A1* | 9/2012 | Ohsawa | H01L 43/12 |
| | | | | 438/3 |
| 2014/0284736 | A1* | 9/2014 | Toko | H01L 43/08 |
| | | | | 257/421 |
| 2014/0349413 | A1* | 11/2014 | Chung | H01L 43/12 |
| | | | | 438/3 |
| 2015/0287912 | A1* | 10/2015 | Park | H01L 43/12 |
| | | | | 257/421 |

OTHER PUBLICATIONS

Anthony J. Annunziata, et al.,"Linear Magnetoresistive Random Access Memory Device With a Self-Aligned Contact Above MRAM Nanowire", U.S. Appl. No. 14/830,913, filed Aug. 20, 2015.

List of IBM Patents or Patent Applications Treated as Related; Date Filed: Feb. 9, 2016, pp. 1-2.

* cited by examiner

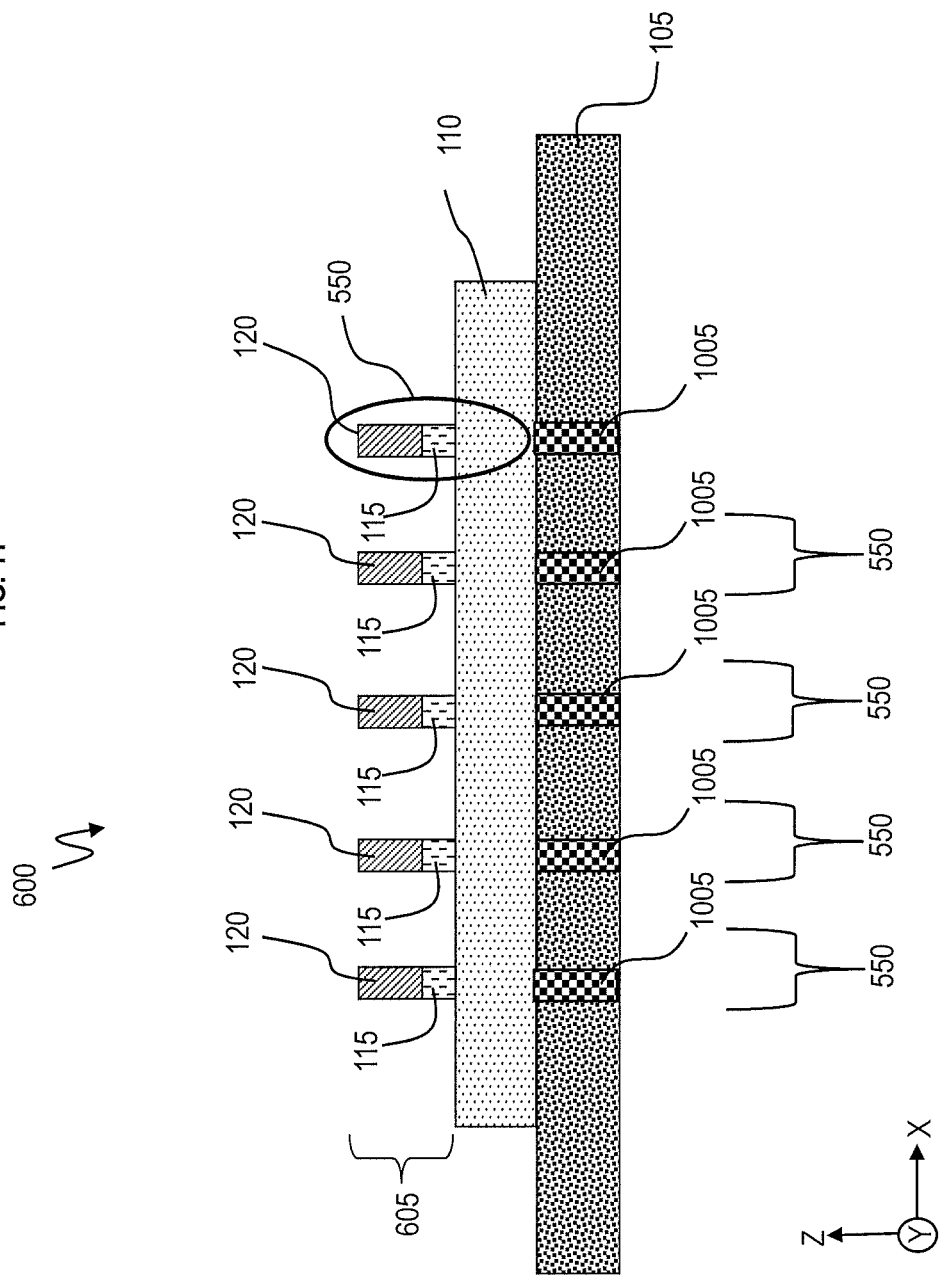

FORMING A LINEAR MAGNETIC TUNNEL JUNCTION STRUCTURE INCLUDING A NON-MAGNETIC TUNNEL BARRIER ON TOP OF A REFERENCE LAYER AND A FREE LAYER ON TOP OF THE NON-MAGNETIC TUNNEL BARRIER, WHEREIN THE LINEAR MAGNETIC TUNNEL JUNCTION STRUCTURE IS IN A LINE 1205

↓

FORMING A PLURALITY OF SELF-ALIGNED CONTACTS ON TOP OF THE LINEAR MAGNETIC TUNNEL JUNCTION STRUCTURE, THE PLURALITY OF SELF-ALIGNED CONTACTS INDIVIDUALLY DEFINING A PLURALITY OF MAGNETORESISTIVE RANDOM ACCESS MEMORY (MRAM) DEVICES, WHEREIN THE PLURALITY OF SELF-ALIGNED CONTACTS ARE SEPARATED FROM ONE ANOTHER IN THE LINE, AND WHEREIN THE PLURALITY OF MRAM DEVICES ARE FORMED OF THE REFERENCE LAYER, THE NON-MAGNETIC TUNNEL BARRIER, AND THE FREE LAYER, EACH OF THE PLURALITY OF MRAM DEVICES BEING IN THE LINE 1210

↓

FORMING A PLURALITY OF BOTTOM CONDUCTIVE VIAS UNDERNEATH THE LINEAR MAGNETIC TUNNEL JUNCTION STRUCTURE, WHEREIN THE PLURALITY OF BOTTOM CONDUCTIVE VIAS ABUT THE REFERENCE LAYER OF THE LINEAR MAGNETIC TUNNEL JUNCTION STRUCTURE 1215

US 9,537,086 B1

LINEAR MAGNETORESISTIVE RANDOM ACCESS MEMORY DEVICE WITH A SELF-ALIGNED CONTACT ABOVE MRAM NANOWIRE

DOMESTIC PRIORITY

This application is a continuation of U.S. patent application Ser. No. 14/830,913, filed Aug. 20, 2015, the disclosure of which is incorporated by reference herein in its entirety.

BACKGROUND

The present invention relates to magnetic memory and magnetic storage devices, and more specifically, to linear magnetoresistive random access memory devices (MRAM) with self-aligned top contacts.

Unlike conventional RAM chip technologies, data in MRAM is not stored as electric charge or current flows, but by magnetic storage elements. The magnetic storage elements are formed from two ferromagnetic plates, each of which can hold a magnetization, separated by a thin insulating layer. One of the two ferromagnetic plates is a permanent magnet set to a particular polarity, while the other plate has a magnetization that can be changed to match that of an external field or that can be changed using an applied current to store memory. This configuration is known as a magnetic tunnel junction and is the simplest structure for an MRAM bit/cell. A memory device is built from a grid of such cells.

SUMMARY

According to one embodiment, a linear magnetoresistive random access memory (MRAM) device is provided. A linear magnetic tunnel junction structure includes a non-magnetic tunnel barrier on top of a reference layer and a free layer on top of the non-magnetic tunnel barrier. The linear magnetic tunnel junction structure is in a line. A plurality of magnetoresistive random access memory (MRAM) devices is formed of the reference layer, the non-magnetic tunnel barrier, and the free layer, where each of the plurality of MRAM devices is in the line. A plurality of self-aligned contacts is on top of the linear magnetic tunnel junction structure. The plurality of self-aligned contacts individually defines the plurality of MRAM devices, and the plurality of self-aligned contacts is separated from one another in the line. A plurality of bottom conductive vias is underneath the linear magnetic tunnel junction structure, where the plurality of bottom conductive vias abuts the reference layer of the linear magnetic tunnel junction structure.

According to one embodiment, a method of forming a linear magnetoresistive random access memory (MRAM) device is provided. The method includes forming a linear magnetic tunnel junction structure including a non-magnetic tunnel barrier on top of a reference layer and a free layer on top of the non-magnetic tunnel barrier, where the linear magnetic tunnel junction structure is in a line. Also, the method includes forming a plurality of self-aligned contacts on top of the linear magnetic tunnel junction structure. The plurality of self-aligned contacts individually defines a plurality of magnetoresistive random access memory (MRAM) devices, where the plurality of self-aligned contacts are separated from one another in the line, and where the plurality of MRAM devices are formed of the reference layer, the non-magnetic tunnel barrier, and the free layer. Each of the plurality of MRAM devices is in the line. Further, the method includes forming a plurality of bottom conductive vias underneath the linear magnetic tunnel junction structure, where the plurality of bottom conductive vias abuts the reference layer of the linear magnetic tunnel junction structure.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 11 is a cross-sectional view of the line/linear magnetoresistive random access memory device with self-aligned contacts according to another embodiment; and FIG. 12 illustrates a method of forming a line/linear magnetoresistive random access memory device according to an embodiment.

DETAILED DESCRIPTION

Embodiments provide a linear magnetoresistive random access memory device with self-aligned top contacts above an MRAM nanowire.

Magnetoresistive random access memory (MRAM) devices offer many benefits over semiconductor based memories such as dynamic random access memory (DRAM) and flash memory. However, patterning the small MRAM devices into islands of metal at the high density and uniformity desired to compete with DRAM and flash is difficult. One of the issues encountered is edge damage due to the reactive ion etch (RIE) that is typically used to subtractively pattern the MRAM device. Another issue is in making electrical contacts to the top of these small MRAM devices. A partial solution to the first issue (i.e., edge damage) is to pattern a line instead of a dot, and this reduces the edge exposure, but it does not resolve the contacting issue. Furthermore, patterning a line instead of a dot then requires a sub-feature size contact that is difficult to pattern and align. Reliable methods of patterning magnetic lines and aligning contacts to the lines at the high density and uniformity to compete with DRAM and flash have not yet been demonstrated.

According to embodiments, a novel patterning and contacting method is proposed for linear MRAM devices. According to an embodiment, a fabrication technique is discussed below to make a linear MRAM device. FIGS. 1 through 11 illustrate an example fabrication technique according to embodiments.

Figure 1:
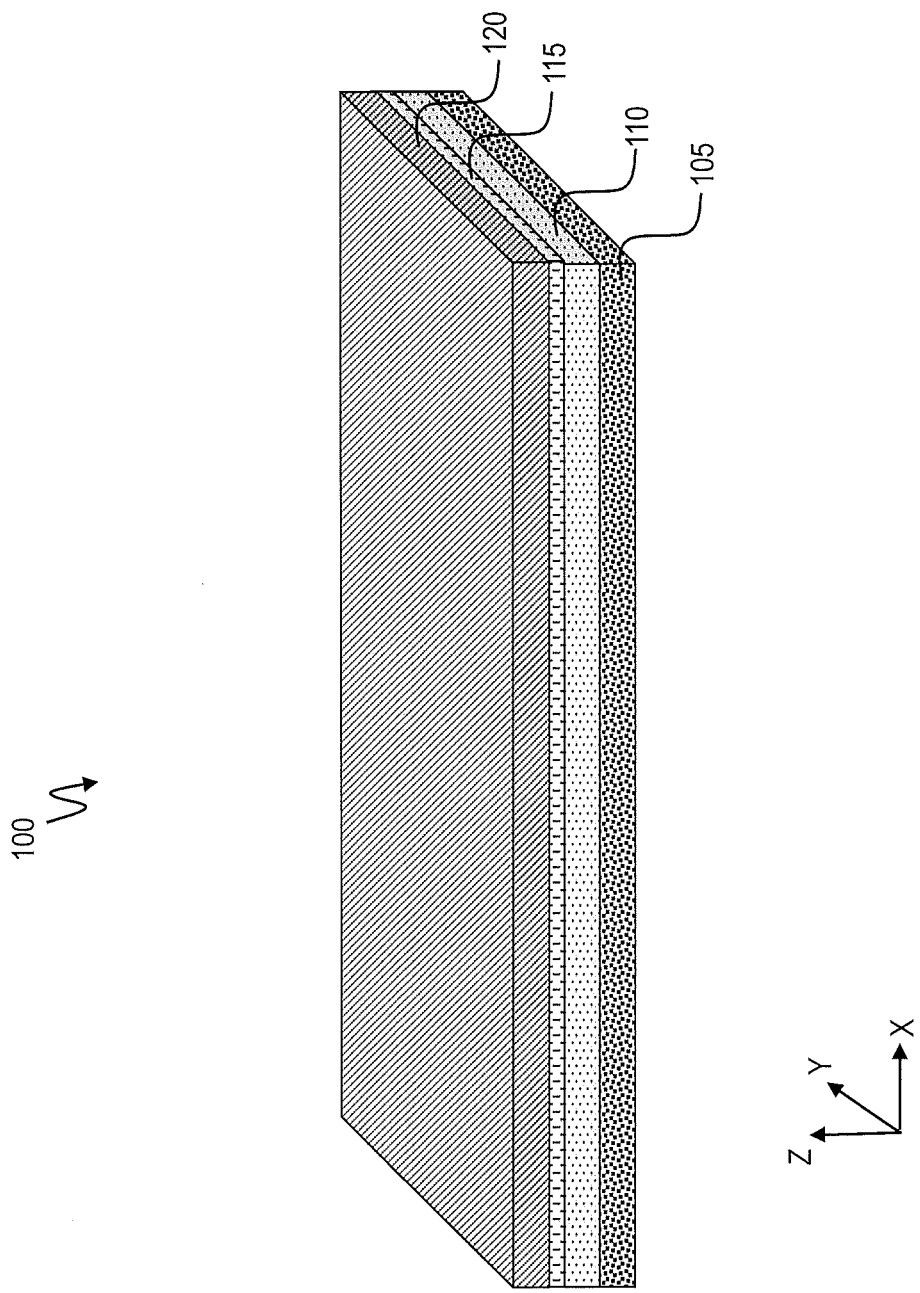
FIG. 1 is a perspective view of an intermediate structure according to an embodiment.
Figure 10:
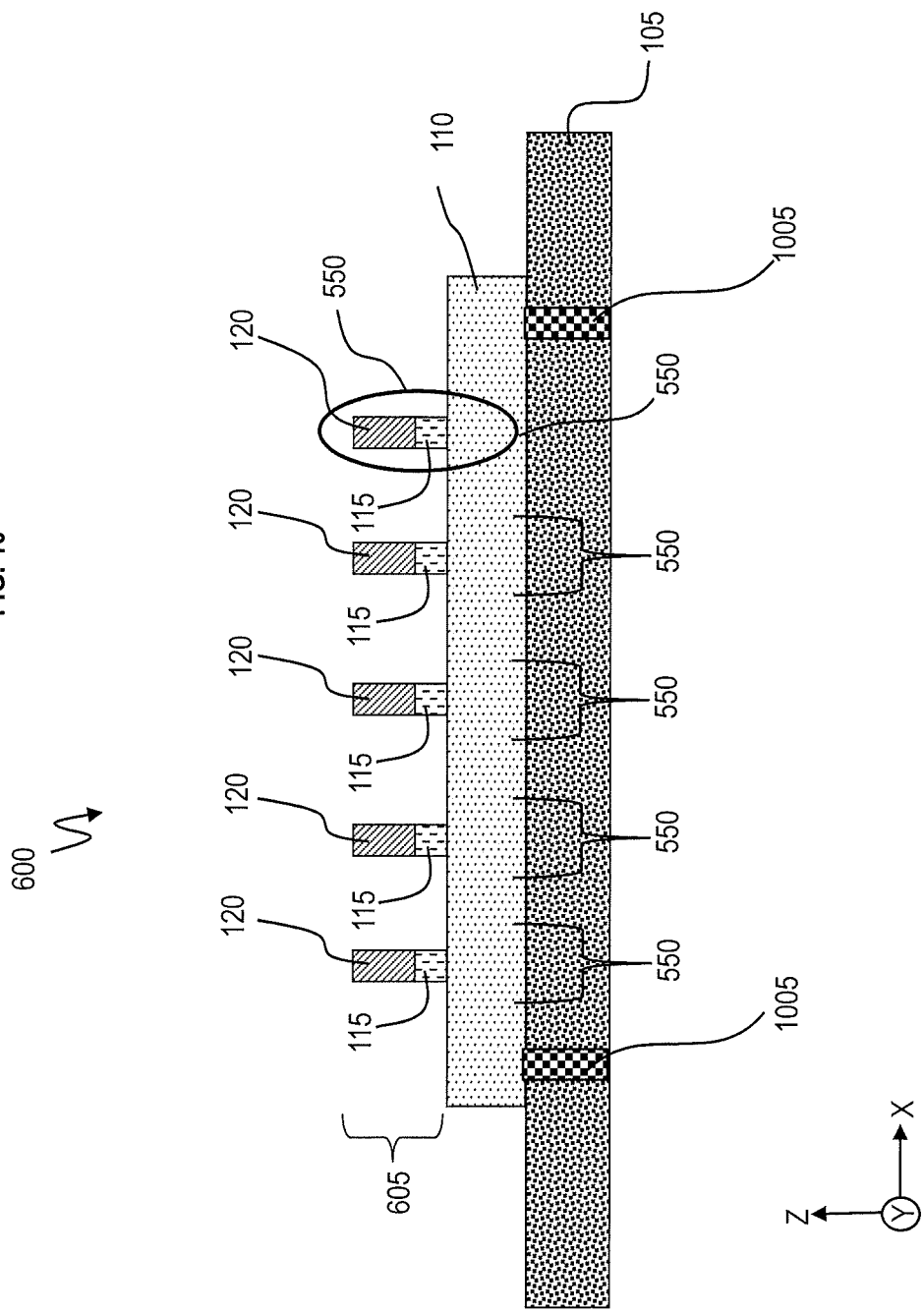
FIG. 10 is a cross-sectional view of the line/linear magnetoresistive random access memory device with self-aligned contacts according to an embodiment.

Now turning to the figures, FIG. 1 is a perspective view of an intermediate structure 100. A magnetic tunnel junction (MTJ) layer/structure 110 is deposited on top of a substrate 105. In one implementation, the substrate 105 may be a dielectric layer, an insulator layer, or a wafer (e.g., silicon). In the substrate 105, there may be conductive vias 1005 (shown in FIGS. 10 and 11) cut through the substrate 105 (e.g., coming up from beneath) to contact the bottoms of the magnetic tunnel junction 110 as shown in FIGS. 10 and 11.

Figure 7:
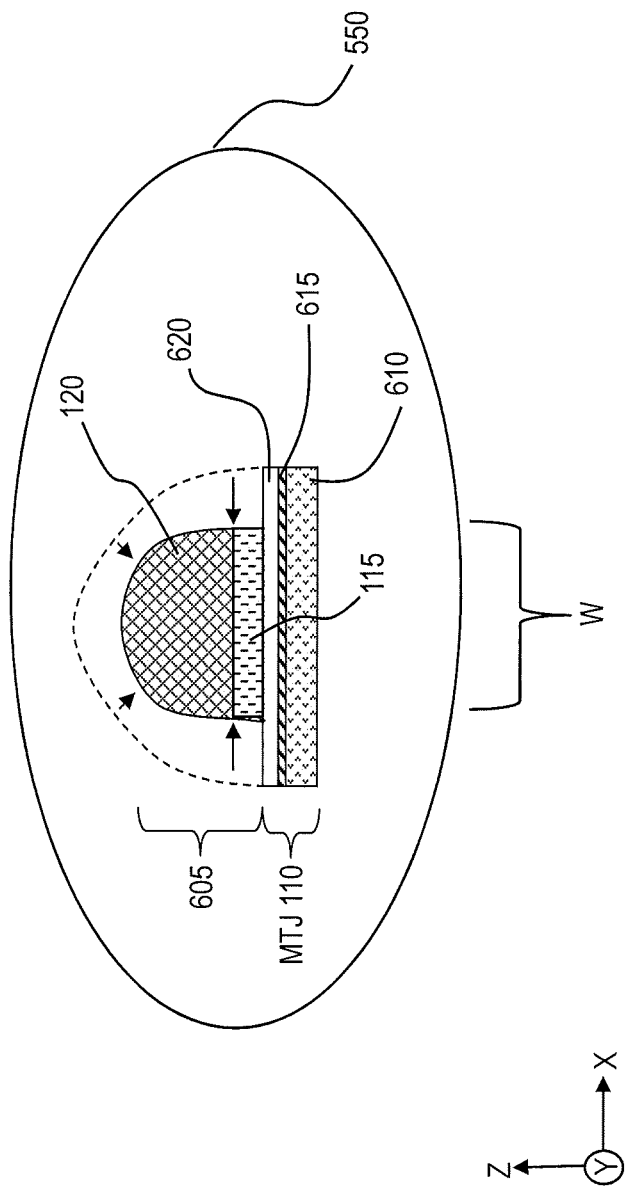
FIG. 7 is a cross-sectional view of an example MRAM device of the line/linear magnetoresistive random access memory device according to an embodiment.
Figure 8:
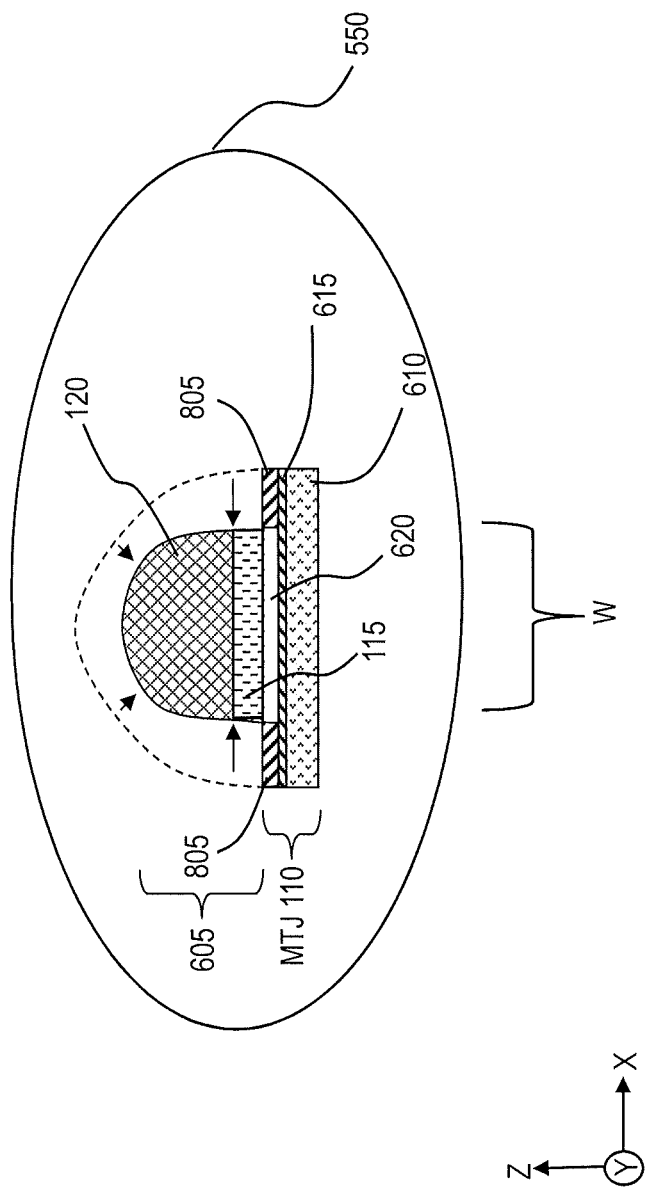
FIG. 8 is a cross-sectional view of an example MRAM device of the line/linear magnetoresistive random access memory device according to another embodiment.
Figure 9:
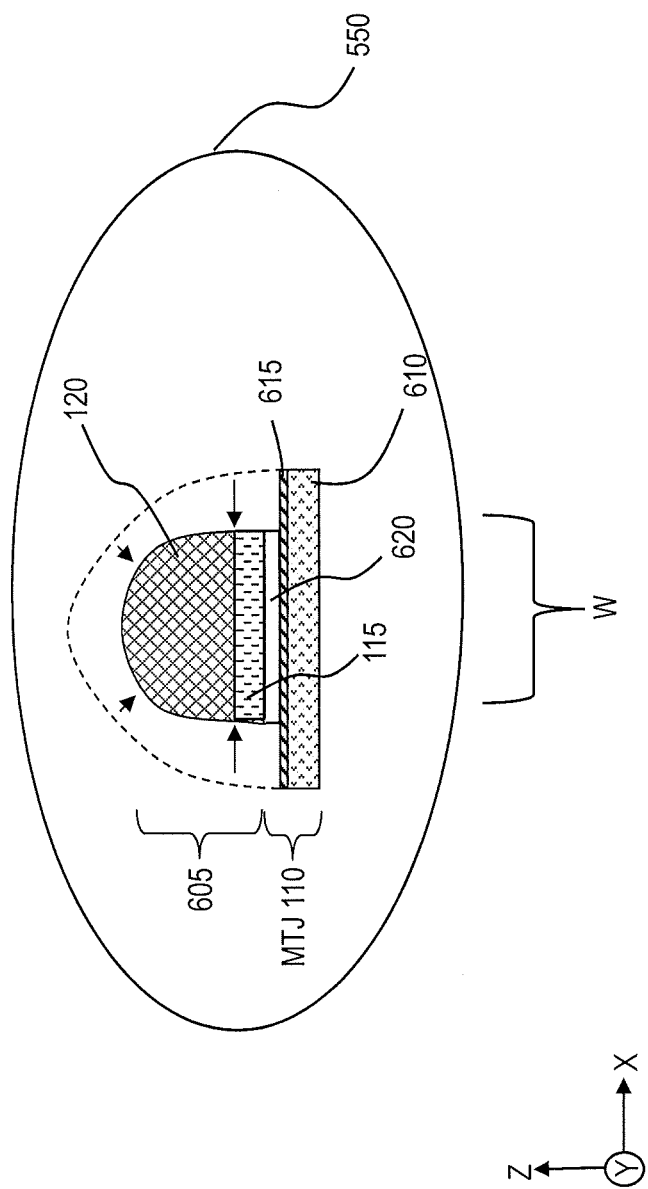
FIG. 9 is a cross-sectional view of an example MRAM device of the line/linear magnetoresistive random access memory device according to yet another embodiment.

Referring back to FIG. 1, the MTJ layer 110 is a structure that includes at least three layers: a reference magnetic layer 610, a non-magnetic tunnel barrier layer 615, and a free magnetic layer 620 shown in FIGS. 7, 8, and 9. The reference magnetic layer 610 and free magnetic layer 620 are made of magnetic materials, such as Fe, Co, etc. The reference magnetic layer 610 has a fixed magnetization, while the free magnetic layer 620 has a magnetization that can be changed. The non-magnetic tunnel barrier layer 615 may be an insulator or dielectric material with a high resistance, and MgO is an example material of the tunnel barrier 615.

A non-magnetic cap layer 115 may be deposited on top of the MTJ layer 110.

A top contact layer 120 may be deposited on top of the non-magnetic cap layer 115. The top contact layer 120 may be a hard mask layer. The top contact 120 may be a metal such as, for example, Ta and/or TaN. In one implementation, the top contact 120 may be a conducting polymer, such as, for example, polyaniline, polythiophene and/or polyfluorene. In another implementation, the top contact 120 may be combinations of metals and conducting polymers, where an example is a TaN/conducting polymer bilayer.

Figure 2:
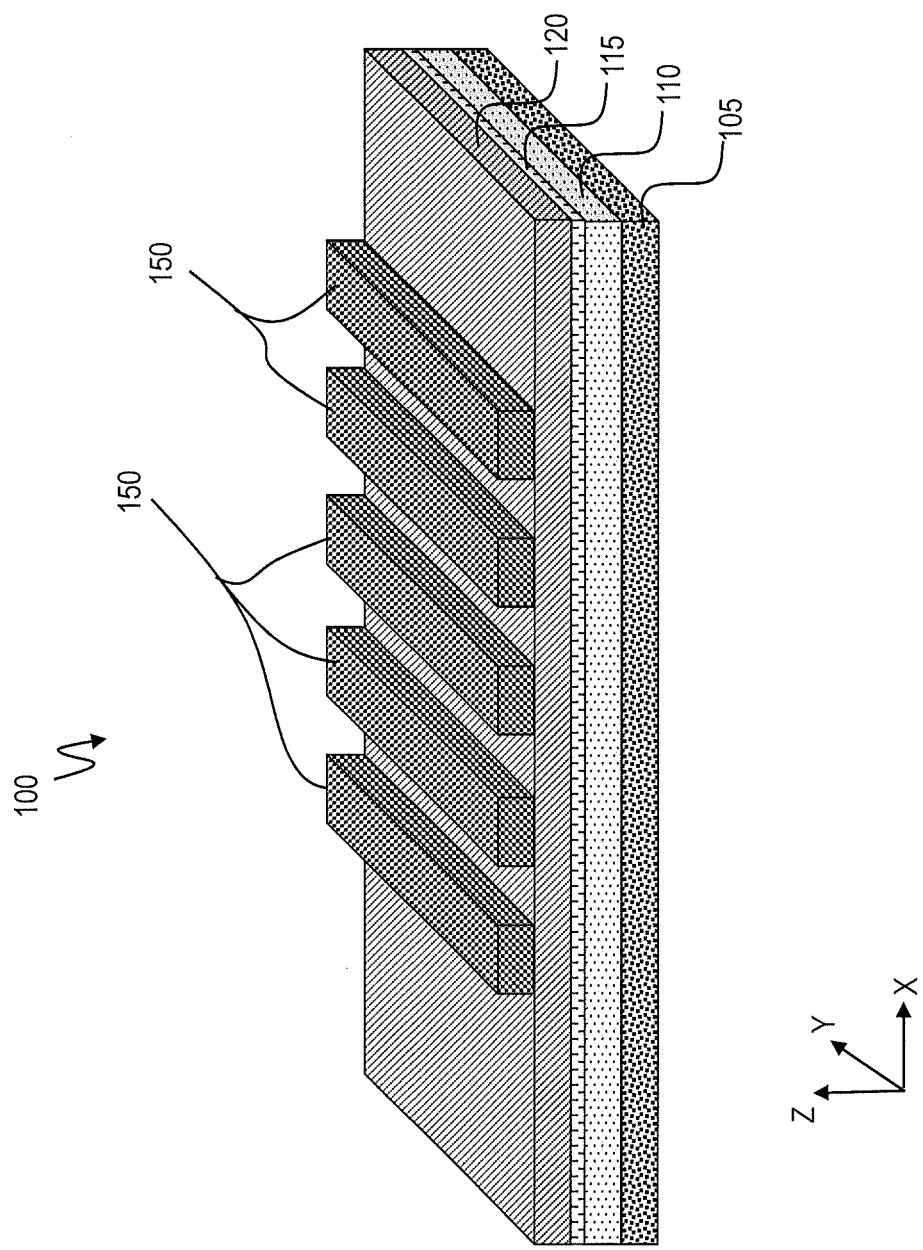
FIG. 2 is a perspective view illustrating a photoresist layer deposited on top of the intermediate structure according to an embodiment.

FIG. 2 is a perspective view illustrating a photoresist layer that has been deposited on top of the top intermediate structure 100. The photoresist layer is patterned into first photoresist strips 150 above the top contact layer 120 in preparation for etching layers below. The photoresist strips 150 are elongated to extend in the y-axis.

Figure 3:
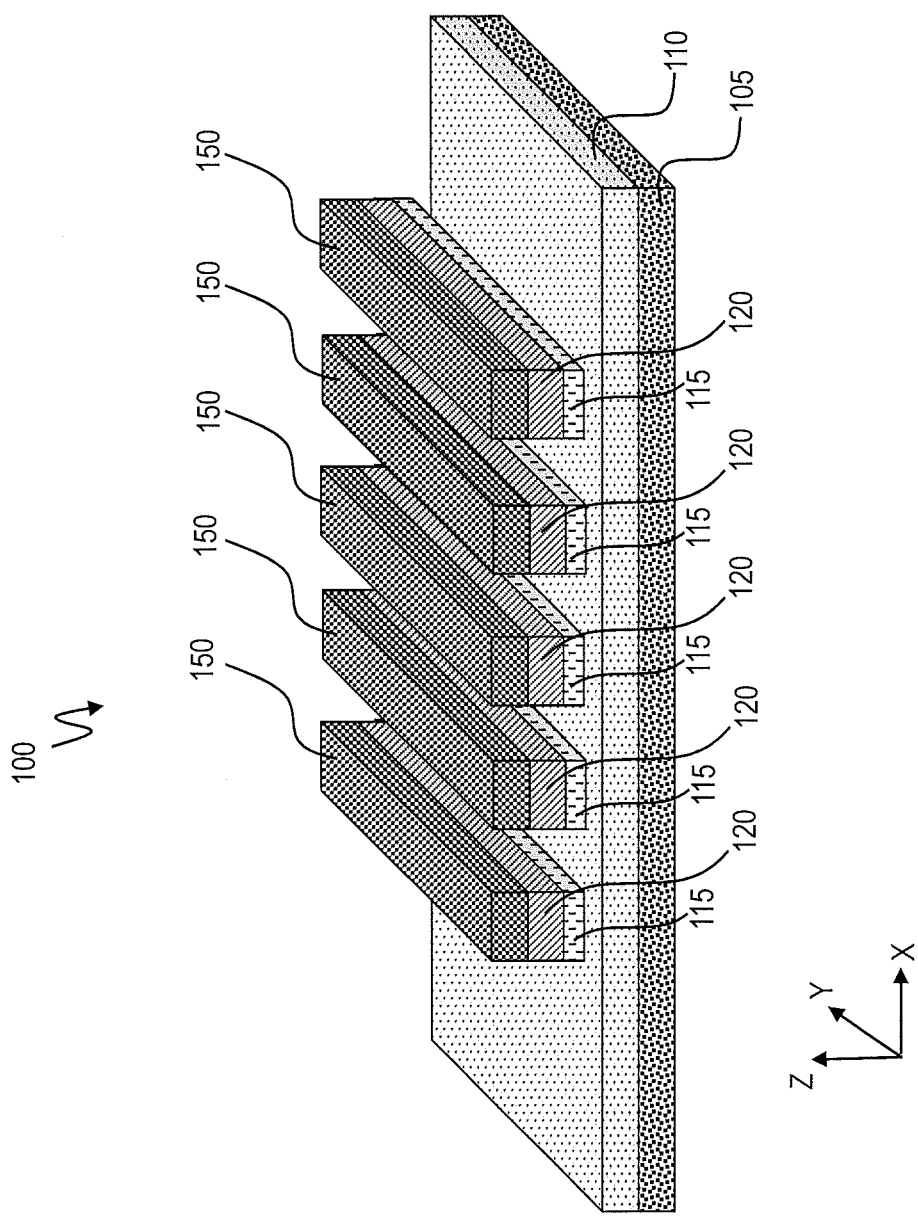
FIG. 3 is a perspective view illustrating the patterned photoresist strips used as an etch mask according to an embodiment.
Figure 6:
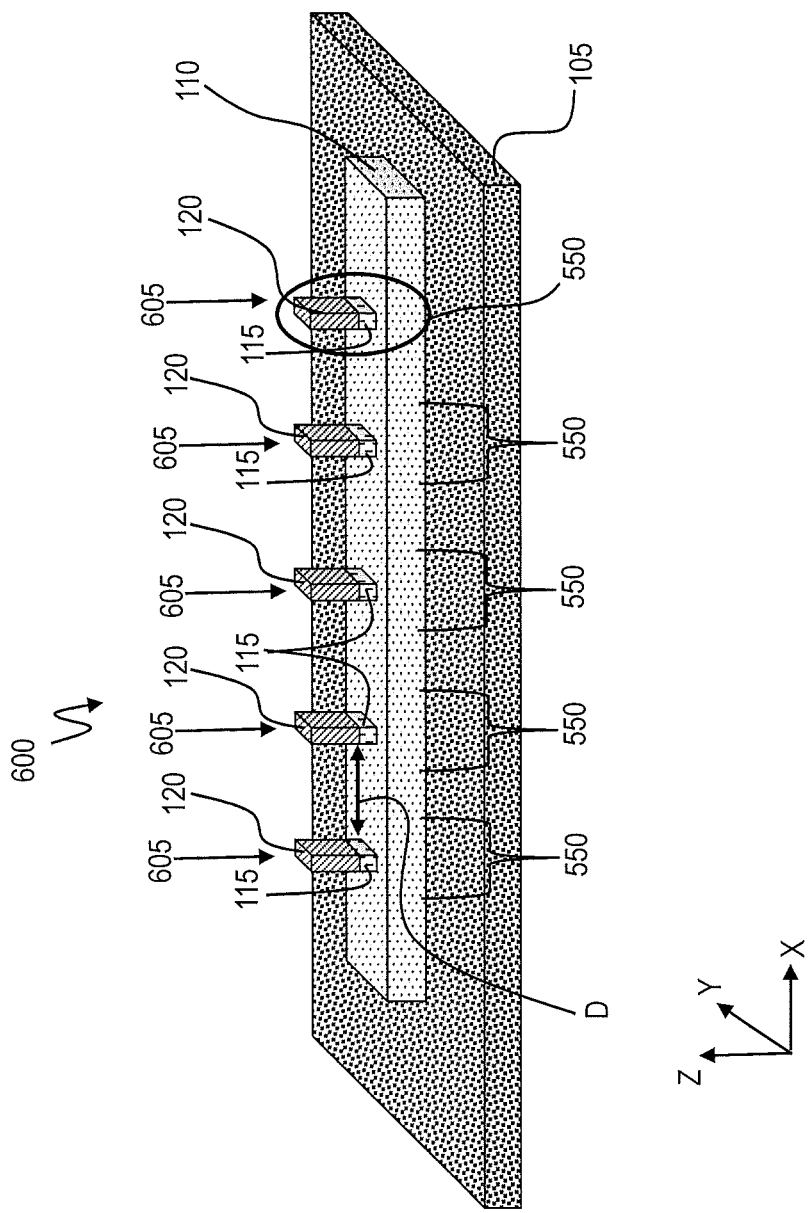
FIG. 6 is a perspective view illustrating a line/linear magnetoresistive random access memory device with self-aligned contacts according to an embodiment.

FIG. 3 is a perspective view illustrating that the patterned photoresist strips 150 act as an etch mask for subtractive etching both the top contact layer 120 and the non-magnetic cap layer 115 stopping on the free magnetic layer 620 as shown in detail in FIG. 6. In another embodiment, this etch may stop on the tunnel barrier 615, thus etching the free magnetic layer 620 as shown in FIG. 8. In another embodiment, this etch may stop on the non-magnetic cap layer 115 above the free magnetic layer 620 (not shown). It should also be appreciated that these photoresist strips may be replaced with multiple layers of photoresist and dielectric hard mask layers, to enable the etch of the contact, and to be performed more easily or reliably.

FIG. 3 shows the top contact layer 120 patterned into top contact strips and the non-magnetic cap layer 115 patterned into non-magnetic cap strips, while the MTJ layer 110 and the substrate 105 remain unpatterned. Both the top contact layer 120 and the non-magnetic cap layer 115 are patterned into elongated strips extending in the y-axis just as the photoresist strips 150. After forming the top contact strips 120 and the non-magnetic cap strips 115, the first photoresist strips 150 are removed.

Figure 4:
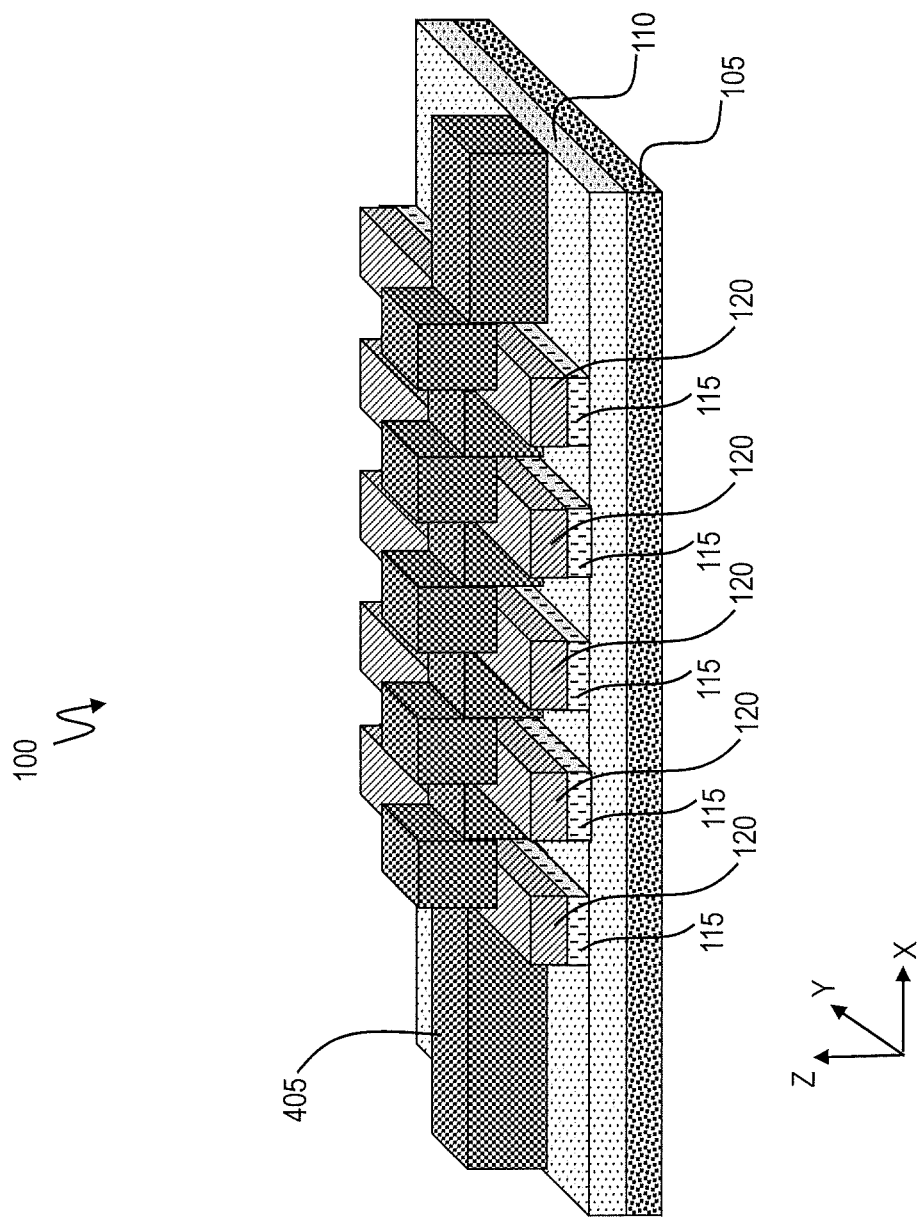
FIG. 4 is a perspective view illustrating another patterned photoresist layer formed on the intermediate structure according to an embodiment.

FIG. 4 is a perspective view illustrating that the intermediate structure 100 has a second photoresist layer, which is deposited conformally and patterned. In FIG. 4, the second photoresist layer is patterned into a photoresist strip 405 perpendicular to the top contact strips 120 and the non-magnetic cap strips 115. The photoresist strip 405 is elongated to extend in the x-axis. The photoresist strip 405 protects the top contact strips 120, non-magnetic cap strips 115, and MTJ layer 110 underneath, in preparation for etching. For illustration purposes, a single photoresist strip 405 is shown so as not to obscure FIG. 4. It should be appreciated that an array of photoresist strips 405 may be formed on the top contact strips 120 and MTJ layer 110. It should also be appreciated that this photoresist strip may be replaced with multiple layers of photoresist and dielectric hard mask layers, to enable the etch of the contact, cap, and MTJ layers to be performed more easily or more reliably.

Figure 5:
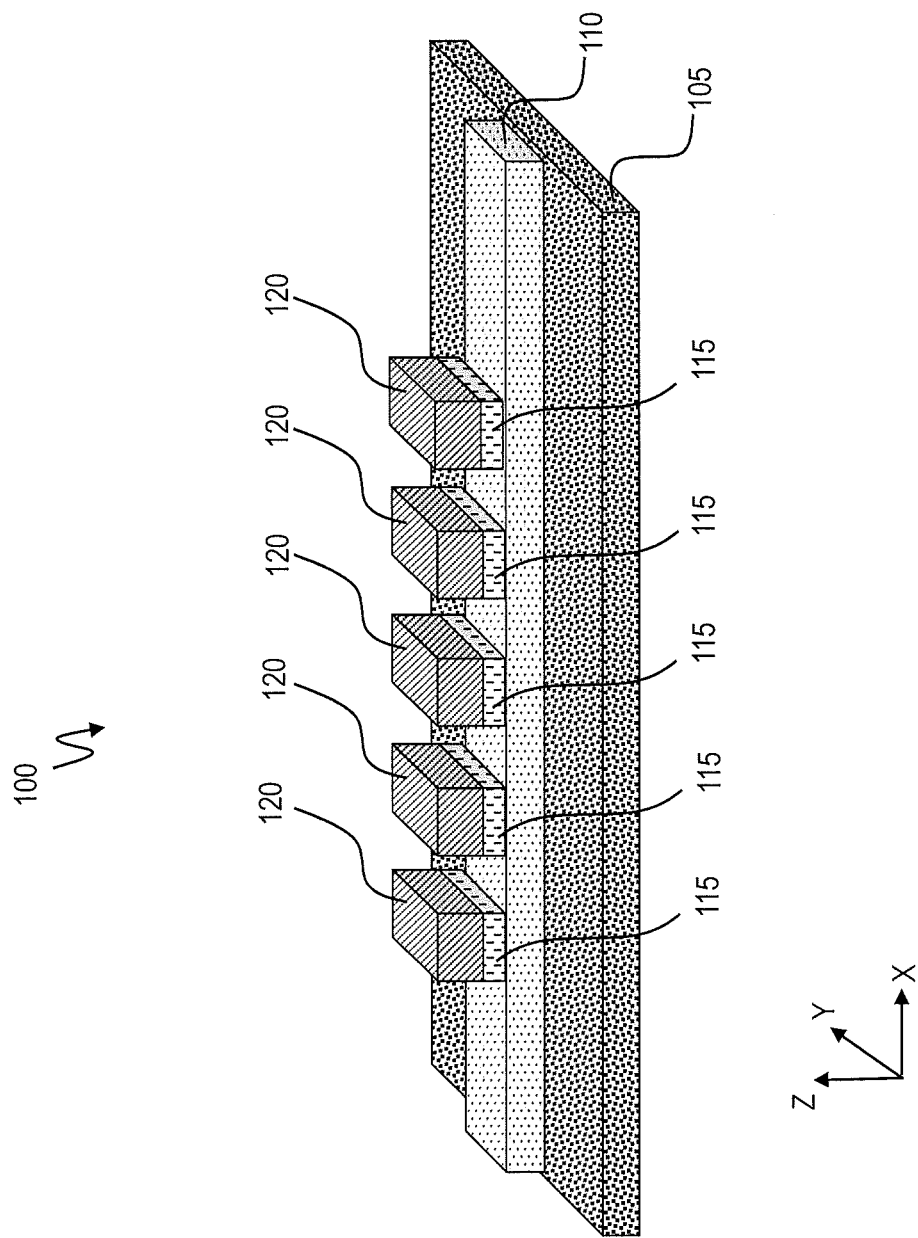
FIG. 5 is a perspective view illustrating etching a top contact layer, non-magnetic cap layer, and magnetic tunnel junction layer according to an embodiment.

FIG. 5 is a perspective view illustrating the photoresist strip 405 used as an etch mask for subtractive etching of the top contact layer 120 (e.g., hard mask), the non-magnetic cap layer 115, and the magnetic tunnel junction layer 110. In this implementation, the etching stops on the substrate 105. The etch patterns the MTJ layer 110 into a linear MTJ (a line MTJ nanowire). The etch also patterns the top contact layer 120 and the non-magnetic cap layer 115 into blocks.

FIG. 6 is a perspective view illustrating that top contact block 120 (hard mask) and the non-magnetic cap block 115 are trimmed back using a reactive ion etch, ion beam etch, and/or another subtractive method that is selective to the MTJ layer and/or MTJ cap layer. This etching creates a small (self-aligned) contact 605 (sub-feature size for the technology node used) from the top contact layer 120 and non-magnetic cap layer 115 (in this implementation). The self-aligned contact 605 may be trimmed from a larger width to a width W in the x-axis. The width W may range from 5-50 nanometers. The self-aligned contact 605 is also trimmed in the y-axis and z-axis.

In another embodiment, the small self-aligned contact 605 may include the top contact layer 120 without the non-magnetic cap layer 115. In yet another embodiment, the small contact 605 may include the top contact layer 120, the non-magnetic cap layer 115, and the free magnetic layer 620.

FIG. 6 shows a line/linear magnetoresistive random access memory device 600 with self-aligned contacts 605 (comprising the top contact layer 120). The line/linear magnetoresistive random access memory device 600 includes the MTJ layer 110 (e.g., nanowire), the non-magnetic cap layer 115, and the top contact layer 120. The line MRAM device 600 may comprise a plurality of MRAM devices 550 (also referred to as bits). Each of the MRAM devices 550 includes the line MTJ layer 110 (directly underneath), its own non-magnetic cap layer 115, and its own top contact 120 (contact 605). The self-aligned contact 605 is (automatically) aligned to an individual MRAM device 550, as each self-aligned contact 605 defines an individual MRAM device 550 (i.e., a bit). Each self-aligned contact 605 (consequently, each MRAM device 550) may be separated from one another by a distance D on the MTJ layer 110 (nanowire). The distance D may range from 10-500 nanometers. A circle identifies one MRAM device 550 in order to show further details of the MRAM device 550 as discussed below in FIGS. 7, 8, and 9.

The MTJ layer/structure 110 may be 5-100 nanometers in the x-axis and 5-100 nanometers in the y-axis. A beneficial range is 5-40 nm×5-40 nm; this beneficial range is optimum for low power and high speed device operation.

Although the linear magnetic tunnel junction layer/structure 110 is shown with 5 MRAM devices 550 in a row, it is understood that each linear magnetic tunnel junction structure 110 may contain fewer and/or more MRAM devices 550. In one implementation, the linear magnetic random access memory device 600 may include only a single linear magnetic tunnel junction structure 110 formed with its corresponding MRAM devices 550. In another implementation, the linear magnetic random access memory device 600 may include multiple linear magnetic tunnel junction structures 110 formed with their corresponding MRAM devices 550. The term "linear" in the linear magnetic random access memory device 600 refers to each linear magnetic tunnel junction structure 110 being a continuous line (i.e., a row).

FIG. 7 is a cross-sectional view of one of the MRAM devices 550 on the line/linear magnetoresistive random access memory device 600 according to an embodiment. FIG. 7 shows that the MTJ layer 110 includes a reference magnetic layer 610 (disposed on top of the substrate 105 in FIG. 6), a tunnel barrier 615 disposed on top of the reference magnetic layer 610, and a free magnetic layer 620 disposed on top of the tunnel barrier 615. The self-aligned contact 605 includes the non-magnetic cap layer 115 disposed on the free magnetic layer 620 and the top contact layer 120 disposed on top of the non-magnetic cap layer 115.

In this cross-sectional view, the dashed lines in the shape of a semicircle represent the previous size of the self-aligned contact 605 prior to etching in FIG. 6. The self-aligned contact 605 may be trimmed back (in the x, y, and z-axes) in order to have a smaller active volume of the free magnetic layer 620 underneath. FIG. 7 and FIG. 8 below illustrate examples where the etching discussed in FIG. 3 did not go through the free magnetic layer 620 but stopped on the free magnetic layer 620.

FIG. 8 is a cross-sectional view of one of the MRAM devices 550 on the line/linear magnetoresistive random access memory device 600 according to another embodiment. FIG. 8 shows that an optional oxidation process may be applied to oxidize the thin free magnetic layer 620 into oxidized part 805. The oxidized part 805 of the free magnetic layer 620 is between and separates (electrically) each of the MRAM devices 550. The oxidized part 805 is non-conducting, and thereby electrically isolates one MRAM device 550 from its neighbors (e.g., neighbors to the left or right). Particularly, in the linear magnetic tunnel junction structure 110, the oxidized part 805 serves to separate one MRAM device 550 (corresponding to layers of the MTJ stack) from the next MRAM device 550 beside it. Although each linear magnetic tunnel junction structure 110 contains the same layers 610, 615, 620, the oxidized part 805 serves to electrically isolate one MRAM device 550 in the same row/line (i.e., in the same linear magnetic tunnel junction structure 110) from the next MRAM device 550. Electrical current (including tunneling current) for an individual MRAM device 550 can flow vertically in the z-axis without flowing laterally in the x-axis to affect other MRAM devices 550 in the same linear magnetic tunnel junction structure 110.

The oxidized part 805 of the free magnetic layer 620 may be formed by oxide (e.g., oxygen) plus heat treatment and/or other chemical or physical treatment, such that the free magnetic layer 620 not covered by the self-aligned contact 605 is oxidized. The self-aligned contact 605 protects the covered free magnetic layer 620 from being oxidized, and thus the covered and protected free magnetic layer 620 remains active. The uncovered free magnetic layer 620 on top of the MTJ layer 110 (i.e., nanowire) is oxidized.

In the case where the etching in FIG. 3 is through the free magnetic layer 620, FIG. 9 is a cross-sectional view of one of the MRAM devices 550 according to another embodiment. As can be seen in FIG. 9, the free magnetic layer 620 has been etched to the width W of the self-aligned contact 605. In this embodiment, the free magnetic layer 620 is directly under the self-aligned contact 605 (or may even be considered part of the self-aligned contact 605). Since there is no exposed/uncovered free magnetic layer 620, there is no oxidization process to create the oxidized part 805.

Although only one MRAM device 550 is shown in FIGS. 7-9, it is understood that the details of the MRAM device 550 apply to the other MRAM devices 550.

FIG. 10 is a cross-sectional view of the line/linear magnetoresistive random access memory device 600 with self-aligned contacts 605 according to an embodiment. FIG. 10 shows the plurality of MRAM devices 550 on the substrate 105. Bottom conductive vias 1005 are shown in the substrate 105. The bottom conductive vias 1005 contact the MTJ layer 110 (e.g., nanowire) at opposite ends for electrical connection. The bottom conductive vias 1005 connect to the reference magnetic layer 610, although the individual layers of the MTJ layer 110 are not shown in FIG. 10. FIG. 10 illustrates an embodiment with bottom conductive vias 1005 on opposites but additional conductive vias 1005 may be connected to the MTJ layer 110.

FIG. 11 is a cross-sectional view of the line/linear magnetoresistive random access memory device 600 with self-aligned contacts 605 according to another embodiment. FIG. 11 shows additional bottom conductive vias 1005 connected to the MTJ layer 110. In this embodiment, one bottom conductive via 1005 may be directly or nearly directly under each of the MRAM device 550. Each MRAM device 550 can be individually controlled by its own self-aligned contact 605 (via top contact 120) and its own bottom conductive via 1005 below.

To form the bottom conductive vias 1005, holes may be made through the substrate 105 and the holes are then filled with a conductive material (e.g., metal) that physically contacts the bottom of the MTJ layer 110. In one implementation, the pattern of the bottom conductive vias 1005 may correspond to the pattern of individual MRAM devices 550 (i.e., memory bits) as shown in FIG. 11.

The plurality of bottom conductive vias 1005 may comprise a metal, and the metal may include at least one of Cu, Ta, W, and TaN. The plurality of bottom conductive vias 1005 may comprise a conducting polymer, and the conducting polymer may include at least one of polyaniline, polythiophene, and polyfluorene. The plurality of bottom conductive vias 1005 may comprise a combination of the metal and the conducting polymer.

Now turning to FIG. 12, a method of forming a linear magnetoresistive random access memory (MRAM) device 600 is provided according to an embodiment.

At block 1205, a linear magnetic tunnel junction structure 110 is formed in which the MTJ structure 110 includes a non-magnetic tunnel barrier 615 on top of a reference layer 610 and a free layer 620 on top of the non-magnetic tunnel barrier 615, where the linear magnetic tunnel junction structure is in a line (along the x-axis).

At block 1210, a plurality of self-aligned contacts 605 are formed on top of the linear magnetic tunnel junction structure 110, in which the plurality of self-aligned contacts 605 individually define a plurality of magnetoresistive random access memory (MRAM) devices 550, where the plurality of self-aligned contacts 605 are separated from one another in the line, and where the plurality of MRAM devices 550 are formed of the reference layer 610, the non-magnetic tunnel barrier 615, and the free layer 620. Each of the plurality of MRAM devices 550 are arranged in the line.

At block 1215, a plurality of bottom conductive vias 1005 are formed underneath the linear magnetic tunnel junction structure 110, where the plurality of bottom conductive vias 1005 abut the reference layer 610 of the linear magnetic tunnel junction structure 110.

The plurality of self-aligned contacts 605 each comprises a top contact layer 120. The plurality of self-aligned contacts 605 each comprises a non-magnetic cap layer 115.

The plurality of self-aligned contacts 605 have been etched to a first size (e.g., width W). The plurality of self-aligned contacts 605 each comprises a top contact layer 120, where the top contact layer 120 has been etched to the first size (e.g., width W). The plurality of self-aligned contacts 605 each comprises a non-magnetic cap layer 115, where the non-magnetic cap layer 115 has been etched to the first size (e.g., width W).

The free layer 620 of the linear magnetic tunnel junction structure 110 has been etched to the first size (e.g., width W) corresponding to the plurality of self-aligned contacts 605 as illustrated in FIG. 9, and the non-magnetic cap layer 115 having been etched to the first size (e.g., width W) is disposed on top of the free layer 620.

The plurality of self-aligned contacts 605 are disposed on top of the free layer 620 such that the free layer 620 has covered parts and uncovered parts, and the uncovered parts of the free layer 620 are oxidized (e.g., oxidized part 805 in FIG. 8). The uncovered parts of the free layer 620 that have been oxidized are configured to delineate one of the plurality of MRAM devices 550 from a neighboring one, while the covered parts of the free layer 620 are active. Each of the plurality of self-aligned contacts 605 is self-aligned to one of the plurality of MRAM devices 550 by protecting one of the covered parts of the free layer 620. This allows the covered part of the free layer 620 to not be oxidized into the oxidized part 805, and thus remain active. Active means that the covered part (non-oxidized part) directly under the self-aligned contact conducts electricity and has a magnetization that can be changed to match that of an external field or that can be changed using an applied current to store memory.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of forming a linear magnetoresistive random access memory (MRAM) device, the method comprising:

forming a linear magnetic tunnel junction structure including a non-magnetic tunnel barrier on top of a reference layer and a free layer on top of the non-magnetic tunnel barrier, wherein the linear magnetic tunnel junction structure is in a line, wherein a plurality of bottom conductive vias are underneath the linear magnetic tunnel junction structure;

forming a plurality of self-aligned contacts on top of the linear magnetic tunnel junction structure, the plurality of self-aligned contacts individually defining a plurality of magnetoresistive random access memory (MRAM) devices, wherein the plurality of self-aligned contacts are separated from one another in the line, wherein the plurality of MRAM devices are formed of the reference layer, the non-magnetic tunnel barrier, and the free layer, each of the plurality of MRAM devices being in the line wherein the plurality of bottom conductive vias directly abut the reference layer of the linear magnetic tunnel junction structure, wherein a dimension of one of the plurality of self-aligned contacts corresponds to a dimension of one of the plurality of bottom conductive vias, wherein the plurality of self-aligned contacts are disposed on top of the free layer such that the free layer has covered parts and uncovered parts, and wherein the uncovered parts of the free layer are oxidized.

2. The method of claim 1, wherein the plurality of self-aligned contacts each comprise a top contact layer.

3. The method of claim 1, wherein the plurality of self-aligned contacts each comprise a non-magnetic cap layer.

4. The method of claim 1, wherein the plurality of self-aligned contacts have been etched to a first size.

5. The method of claim 4, wherein the plurality of self-aligned contacts each comprise a top contact layer, the top contact layer having been etched to the first size.

6. The method of claim 4, wherein the plurality of self-aligned contacts each comprise a non-magnetic cap layer, the non-magnetic cap layer having been etched to the first size.

7. The method of claim 1, wherein the uncovered parts of the free layer that have been oxidized are configured to delineate one of the plurality of MRAM devices from a neighboring one, while the covered parts of the free layer are active.

8. The method of claim 7, wherein each of the plurality of self-aligned contacts is self-aligned to one of the plurality of MRAM devices by protecting one of the covered parts of the free layer.

9. The method of claim 1, wherein the free layer has a corresponding dimension as the dimension of the one of the plurality of self-aligned contacts.

\* \* \* \* \*